United States Patent [19]

Kobatake

[11] Patent Number: 5,057,722
[45] Date of Patent: Oct. 15, 1991

[54] DELAY CIRCUIT HAVING STABLE DELAY TIME

[75] Inventor: Hiroyuki Kobatake, Tokyo, Japan
[73] Assignee: NEC Corporation, Tokyo, Japan
[21] Appl. No.: 541,145
[22] Filed: Jun. 20, 1990

[30] Foreign Application Priority Data

Jun. 20, 1989 [JP]  Japan .................................. 1-158585

[51] Int. Cl.[5] .................... H03K 5/13; H03K 5/08; H03B 1/04
[52] U.S. Cl. .................................. 307/605; 307/542; 307/558; 307/585; 307/594; 307/597
[58] Field of Search ............... 307/605, 254, 451, 585, 307/270, 594, 597, 542, 558

[56] References Cited

U.S. PATENT DOCUMENTS 4,837,466  6/1989  Kanauchi ............................ 307/605
4,947,064  8/1990  Kim et al. ........................... 307/605

Primary Examiner—Stanley D. Miller
Assistant Examiner—Trong Phan
Attorney, Agent, or Firm—Whitham & Marhoefer

[57] ABSTRACT

A delay circuit comprises a first inverter including a first MOSFET of a P-channel type having a gate connected to an input terminal, a drain connected to a first node and a source connected to a high voltage supply line; and a second MOSFET of an N-channel type having a gate connected to the input terminal, a drain connected through a first resistor to the first node and a source connected to ground. There is provided a current mirror circuit having an input side current path connected in parallel to the first MOSFET, and an output side current path connected between the first voltage supply line and a second node. A capacitor is connected between the second node and the ground, and there is provided a third MOSFET of the N-channel type having a gate connected to receive an inverted signal of a signal applied on the input terminal, a drain connected to the second node and a source connected to the second voltage supply line. A second inverter includes a fourth MOSFET of the P-channel type having a gate connected to the second node, a drain connected to an output terminal and a source connected to the high voltage supply line, and a fifth MOSFET of the N-channel type having a gate connected to the input terminal, a drain connected through a second resistor to the output terminal and a source connected to the ground.

8 Claims, 3 Drawing Sheets

DELAY CIRCUIT HAVING STABLE DELAY TIME

BACKGROUND OF THE INVENTION

1. Field of the Invention

The present invention relates to a delay circuit, and more specifically to a delay circuit which is suitable for implementation in a MOS (metal oxide semiconductor) integrated circuit.

2. Description of Related Art

In the prior art, one typical delay circuit implemented in a MOS integrated circuit is composed of a first CMOS (complementary MOS) inverter having an input connected to an input terminal, a second CMOS inverter having an output connected to an output terminal and an integration circuit formed of a resistor and a capacitor and connected between an output of the first CMOS inverter and an input of the second CMOS inverter. In this delay circuit, a delay time is determined by a resistance and a capacitance of the integration circuit and a logical threshold of the second CMOS inverter. The logical threshold of the second CMOS inverter is greatly dependent upon a transconductance $g_m$ and a threshold $V_T$ of each of a P-channel transistor and an N-channel transistor which form the second CMOS inverter. However, the transconductance $g_m$ and the threshold $V_T$ cannot be precisely controlled in an integrated circuit manufacturing process. Therefore, it has been difficult to obtain a desired delay time in the conventional MOS delay circuit. In other words, the delay time will vary dependently upon variation of characteristics of MOS transistors.

SUMMARY OF THE INVENTION

Accordingly, it is an object of the present invention to provide a delay circuit which has overcome the above mentioned defect of the conventional one.

Another object of the present invention is to provide a delay circuit which is suitable for implementation in a MOS integrated circuit and which can obtain a precisely controlled stable delay time which will not vary even if characteristics of MOS transistors forming the delay circuit vary.

The above and other objects of the present invention are achieved in accordance with the present invention by a delay circuit comprising:

an input terminal and an output terminal;

a first MOSFET having a gate connected to the input terminal, and a drain-source path connected at its one end to a first node and at its other end to a first voltage supply line;

a second MOSFET having a gate connected to the first node and a drain-source path connected at its one end to the first node and at its other end to the first voltage supply line;

a third MOSFET having a gate connected to the input terminal, and a drain-source path connected at its one end through a first resistive element to the first node and at its other end to a second voltage supply line;

a fourth MOSFET having a gate connected to the first node, and a drain-source path connected at its one end to a second node and at its other end to the first voltage supply line;

a capacitive element connected between the second node and a predetermined voltage supply line;

a fifth MOSFET having a gate connected to receive an inverted signal of a signal applied on the input terminal, and a drain-source path connected at its one end to the second node and at its other end to the second voltage supply line;

a sixth MOSFET having a gate connected to the second node, and a drain-source path connected at its one end to the output terminal and at its other end to the first voltage supply line; and a seventh MOSFET having a gate connected to the input terminal, and a drain-source path connected at its one end through a second resistive element to the output terminal and at its other end to the second voltage supply line.

In a specific preferred embodiment, the delay circuit in accordance with the present invention comprises:

an input terminal and an output terminal;

a first MOSFET of a first channel type having a gate connected to the input terminal, a drain connected to a first node and a source connected to a first voltage supply line;

a second MOSFET of the first channel type having a gate and a drain connected commonly to the first node and a source connected to the first voltage supply line;

a third MOSFET of a second channel type which is different from the first channel type, the third MOSFET having a gate connected to the input terminal, a drain connected through a first resistor to the first node and a source connected to a second voltage supply line;

a fourth MOSFET of the first channel type having a gate connected to the first node, a drain connected to a second node and a source connected to the first voltage supply line;

a capacitor connected between the second node and a predetermined voltage supply line;

a fifth MOSFET of the second channel type having a gate connected to receive an inverted signal of a signal applied on the input terminal, a drain connected to the second node and a source connected to the second voltage supply line;

a sixth MOSFET of the first channel type having a gate connected to the second node, a drain connected to the output terminal and a source connected to the first voltage supply line; and a seventh MOSFET of the second channel type having a gate connected to the input terminal, a drain connected through a second resistor to the output terminal and a source connected to the second voltage supply line, the second and fourth MOSFETs forming a current mirror circuit, and transconductances of the second, third, sixth and seventh MOSFETs and resistances of the first and second resistors fulfilling the following conditions:

$$g_{m2} = n \times g_{m6}$$

$$g_{m3} = n \times g_{m7}$$

$$R_1 = R_2/n$$

where $g_{m2}$, $g_{m3}$, $g_{m6}$ and $g_{m7}$ are transconductances of the second, third, sixth and seventh MOSFETs, respectively, $R_1$ and $R_2$ are resistances of the first and second resistors, respectively, and n is positively number.

The above and other objects, features and advantages of the present invention will be apparent from the following description of preferred embodiments of the invention with reference to the accompanying drawings.

DESCRIPTION OF THE PREFERRED EMBODIMENTS

Figure 1:
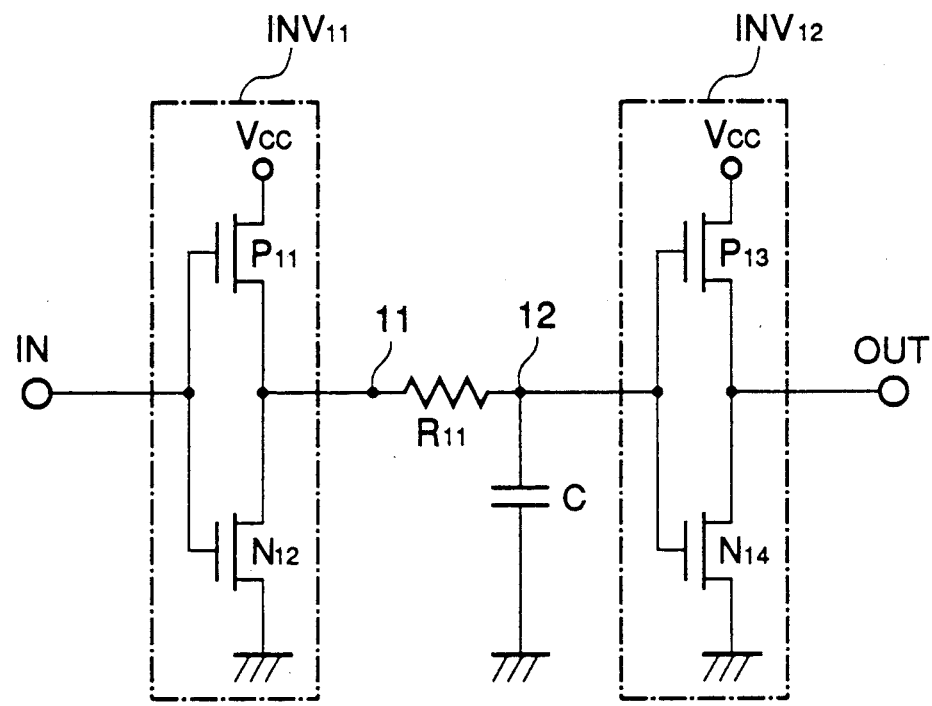
FIG. 1 is a circuit diagram of a typical conventional delay circuit composed of CMOS circuits.

Referring to FIG. 1, there is shown a circuit diagram of a typical conventional delay circuit composed of CMOS circuits. The shown delay circuit includes an input terminal IN and an output terminal OUT. The delay circuit also includes a first CMOS inverter $INV_{11}$ including a P-channel MOSFET $P_{11}$ and an N-channel MOSFET $N_{12}$ connected in series between a first voltage supply line Vcc and ground, namely, a second voltage supply line GND. An input of the first CMOS inverter $INV_{11}$ is connected to the input terminal IN and an output of the first CMOS inverter $INV_{11}$ is connected to a first node 11. A resistor $R_{11}$ is connected between the first node 11 and a second node 12, and a capacitor C is connected between the second node 12 and the second voltage supply line GND. The delay circuit further includes a second CMOS inverter $INV_{12}$ including a P-channel MOSFET $P_{13}$ and an N-channel MOSFET $N_{14}$ connected in series between the first voltage supply line Vcc and the second voltage supply line GND. An input of the second CMOS inverter $INV_{12}$ is connected to the second node 12 and an output of the second CMOS inverter $INV_{12}$ is connected to the output terminal OUT.

Figure 2:
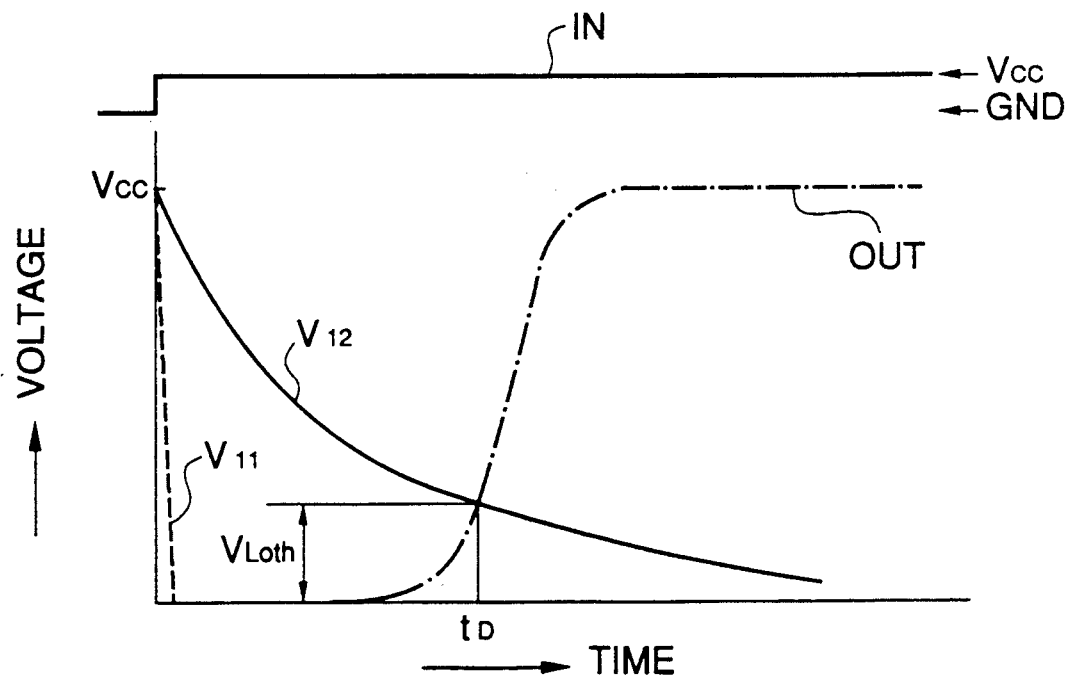
FIG. 2 is a waveform diagram illustrating the characteristics of the conventional delay circuit shown in FIG. 1.

Operation of the circuit shown in FIG. 1 will be described with reference to FIG. 2 which is a waveform diagram illustrating the characteristics of the conventional delay circuit shown in FIG. 1.

Assume that the circuit is in an initialized condition that a low level signal is applied to the input terminal IN and the first and second nodes 11 and 12 are at a high level, respectively, so that a low level signal is outputted from the output terminal OUT. Under this condition, if a high level signal is applied to the input terminal IN, a potential $V_{11}$ of the first node 11 is brought to a low level (the level of the second voltage supply line GND) at the same time as the high level signal is applied to the input terminal IN. Thereafter, a potential $V_{12}$ of the second node 12 will gradually decease in accordance with the following equation (1):

$$V_{12} = Vcc \cdot e^{-t/C \cdot R_{11}} \quad (1)$$

When the potential $V_{12}$ becomes equal to a logical threshold $V_{Loth}$ of the second inverter $INV_{12}$, the output of the second inverter $INV_{12}$ is inverted so that the high level signal output is outputted from the output terminal OUT, with the result that the delay time $t_D$ is obtained.

The delay time $t_D$ obtained in the delay circuit of FIG. 1 is expressed in the following equation (2):

$$t_D = C \cdot R_{11} \cdot ln\ (Vcc/V_{Loth}) \quad (2)$$

Figure 3:
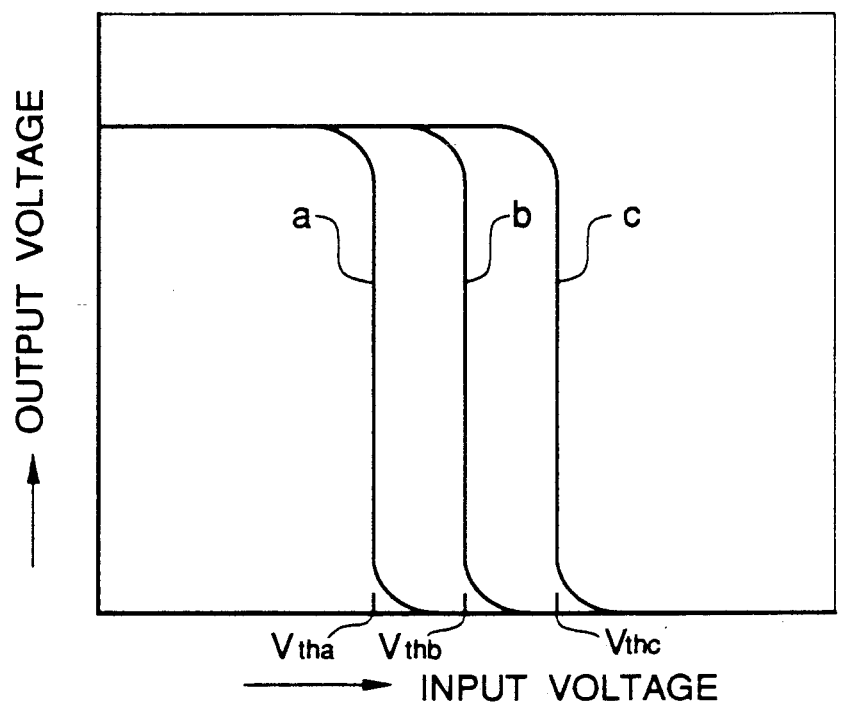
FIG. 3 is a graph illustrating an input-output characteristics of an inverter.

As seen from the equation (2), the delay time obtained in the delay circuit of FIG. 1 is dependent upon the value of the capacitor C and the value of the resistor $R_{11}$ and the logical threshold $V_{Loth}$ of the second inverter $INV_{12}$. The logical threshold $V_{Loth}$ of the second inverter $INV_{12}$ varies when a transconductance $g_m$ and a threshold Vth of each of MOSFETs forming the second inverter $INV_{12}$ vary. For example, assume that a logical threshold is set to $V_{thb}$ as shown in FIG. 3. However, the transconductance $g_m$ and the threshold Vth will inevitably vary due to variation or dispersion in fabrication. Therefore, if the transconductance $g_m$ of the MOSFET $P_{13}$ becomes small or if the threshold $V_T$ of the MOSFET $P_{13}$ becomes high, or if the transconductance $g_m$ of the MOSFET $N_{14}$ becomes large or if the threshold $V_T$ of the MOSFET $N_{14}$ becomes low, the input/output characteristics of the inverter becomes as shown in a curve "a" in FIG. 3, and therefore, the logical threshold will be lowered to $V_{tha}$. On the other hand, if the transconductance $g_m$ of the MOSFET $P_{13}$ becomes large or if the threshold $V_T$ of the MOSFET $P_{13}$ becomes low, or if the transconductance $g_m$ of the MOSFET $N_{14}$ becomes small or if the threshold $V_T$ of the MOSFET $N_{14}$ becomes high, the input/output characteristics of the inverter becomes as shown in a curve "c" in FIG. 3, and therefore, the logical threshold will be raised to $V_{thc}$. Accordingly, if the transconductance $g_m$ and the threshold Vth of each of MOSFETs forming the second inverter $INV_{12}$ vary, the logical threshold $V_{Loth}$ of the second inverter $INV_{12}$ will vary, and therefore, the delay time $t_D$ will also vary.

Figure 4:
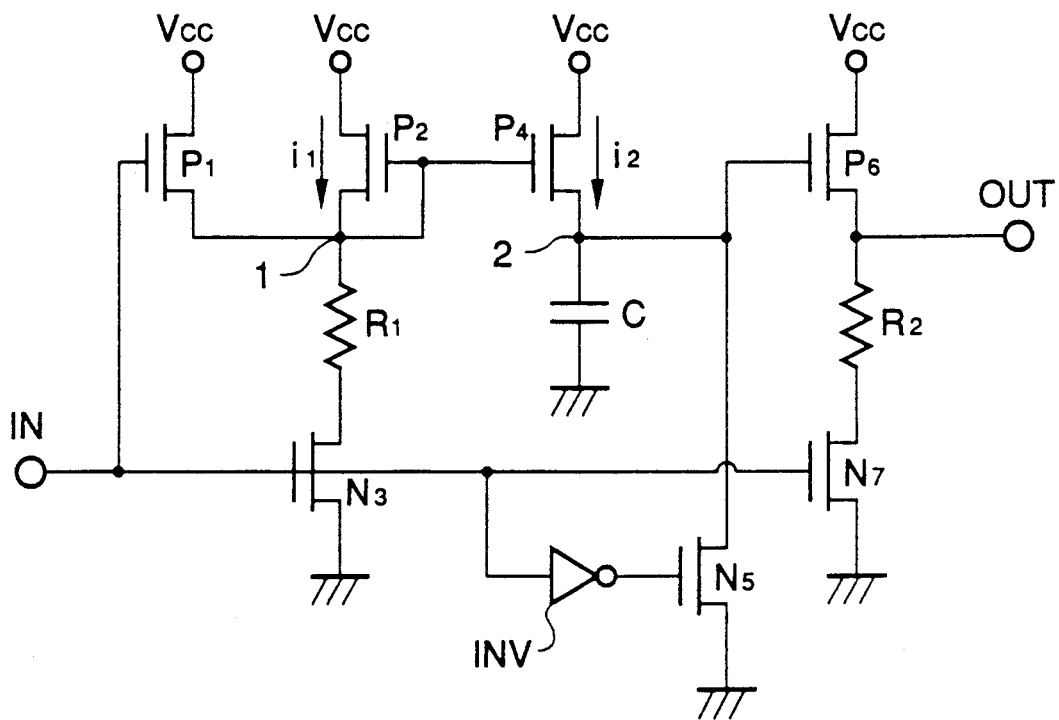
FIG. 4 is a circuit diagram of a first embodiment of the delay circuit in accordance with the present invention.

Referring to FIG. 4, there is shown a circuit diagram of a first embodiment of the delay circuit in accordance with the present invention.

The shown delay circuit includes an input terminal IN and an output terminal OUT. The delay circuit also includes a first MOSFET $P_1$ of the P-channel type having a gate connected to the input terminal IN, a drain connected to a first node 1 and a source connected to a first voltage supply line Vcc; a second MOSFET $P_2$ of the P-channel type having a gate and a drain connected commonly to the first node 1 and a source connected to the first voltage supply line Vcc; a third MOSFET $N_3$ of the N-channel type having a gate connected to the input terminal IN, a drain connected through a resistor $R_1$ to the first node 1 and a source connected to a second voltage supply line GND; a fourth MOSFET $P_4$ of the P-channel type having a gate connected to the first node 1, a drain connected to a second node 2 and a source connected to the first voltage supply line Vcc; a capacitor C connected between the second node 2 and the second voltage supply line GND; a fifth MOSFET $N_5$ of the N-channel type having a gate connected through an inverter INV to the input terminal IN, a drain connected to the second node 2 and a source connected to the second voltage supply line GND; a sixth MOSFET $P_6$ of the P-channel type having a gate connected to the second node 2, a drain connected to the output terminal OUT and a source connected to the first voltage supply line Vcc; and a seventh MOSFET $N_7$ of the N-channel type having a gate connected to the input terminal IN, a drain connected through a resistor $R_2$ to the output terminal OUT and a source connected to a second voltage supply line GND.

Figure 5:
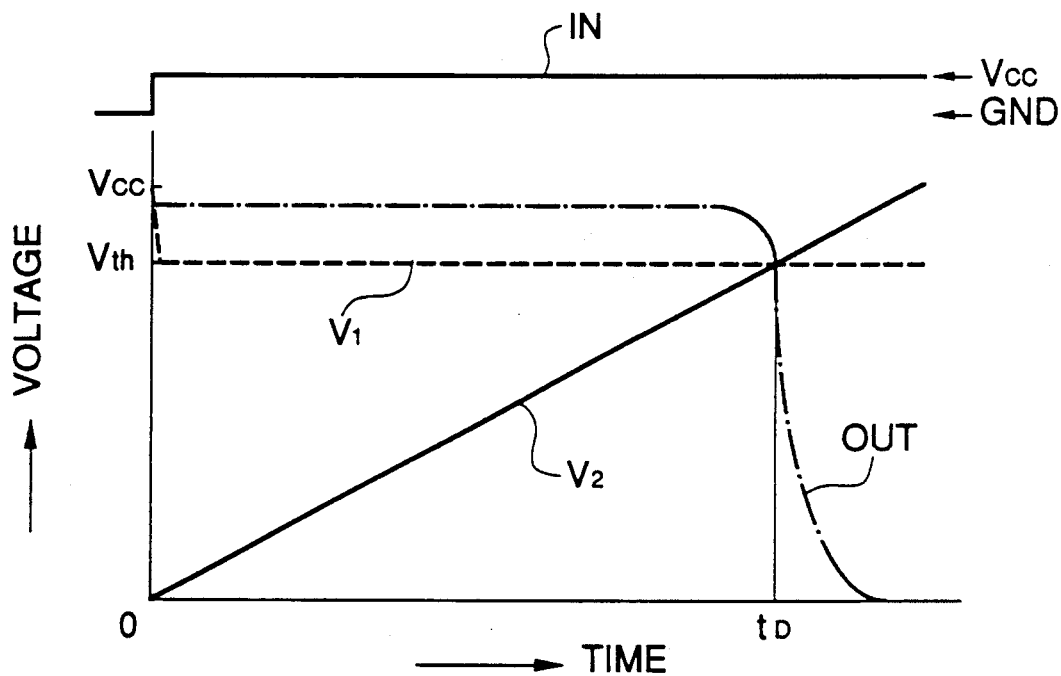
FIG. 5 is a waveform diagram illustrating the characteristics of the delay circuit shown in FIG. 4.

Now, operation of the circuit shown in FIG. 4 will be described with reference to FIG. 5 which is a waveform diagram illustrating the characteristics of the delay circuit shown in FIG. 4.

Assume that the circuit is in an initialized condition that a low level signal is applied to the input terminal IN, so that the transistors $P_1$, $N_5$ and $P_6$ are on and the transistors $P_2$, $N_3$, $P_4$ and $N_7$ are off, and therefore, a potential $V_1$ of the first node 1 is at a high level (Vcc) and and a potential $V_2$ of the second node 2 is at a low level (GND), with the result that a high level signal is outputted from the output terminal OUT. Under this condition, if a high level signal is applied to the input terminal IN, the transistor $N_3$ and $N_7$ are turned on, and the transistors $P_1$ and $N_5$ are turned off. Here, if a transconductance $g_{mN3}$ of the transistor $N_3$ is set to be greater than a factor $1/R_1$ ($g_{mN3} >> 1/R_1$), the potential $V_1$ of the first node 1 assumes a potential Vth which is determined by a transconductance $g_{mP2}$ of the transistor $P_2$ and a resistance of the resistor $R_1$. Therefore, a current $i_1$ flowing through the transistor $P_2$ is expressed in the following equation (3):

$$i_1 = V_{th}/R_1 \quad (3)$$

Since a mirror circuit is formed by the transistors $P_2$ and $P_4$, if a transconductance $g_m$ of the transistor $P_4$ is called "$g_{mP4}$", when the transistor $P_4$ operates in a saturation region, a current $i_2$ flowing through the transistor $P_4$ is expressed in the following equation (4):

$$i_2 = \{g_{mP4}/g_{mP2}\} \times i_1 \quad (4)$$

Since the capacitor C is charged up by the current $i_2$, the potential $V_2$ of the second node 2 can be expressed in the following equation (5):

$$\begin{aligned}V_2 &= i_2/C \\ &= \{V_{th}/R_1 \cdot C\} \cdot \{g_{mP4}/g_{mP2}\}\end{aligned} \quad (5)$$

Here, if it is set that the transconductances of the transistors $P_2$ and $P_6$ are the same, the transconductances of the transistors $N_3$ and $N_7$ are the same and the resistances of the resistors $R_1$ and $R_2$ are the same, an inverter which includes a driver formed of the transistor $P_6$ and a load formed of the second resistor $R_2$ and the transistor $N_7$, will have a logical threshold represented by Vth. The reason for this is that: the same inverter as the inverter which includes the transistor $P_6$ as a driver and the second resistor $R_2$ and the transistor $N_7$ as a load, is formed of the transistor $P_2$ and the resistor $R_1$ and the transistor $N_3$. Since an input of the inverter formed of the transistor $P_2$ and the resistor $R_1$ and the transistor $N_3$, namely the gate of the transistor $P_2$ is connected to the first node 1 which is an output of the inverter formed of the transistor $P_2$ and the resistor $R_1$ and the transistor $N_3$, the first node 1 is biased to the logical threshold of the inverter formed of the transistor $P_2$ and the resistor $R_1$ and the transistor $N_3$. As mentioned above, the potential $V_1$ of the first node is Vth.

Accordingly, when the potential $V_2$ of the second node 2 becomes equal to Vth, the inverter composed of the transistor $P_6$, the resistor $R_2$ and the transistor $N_7$ is inverted so as to generate a low level signal to the output terminal OUT. The delay time $t_D$ is given a time until the potential $V_2$ of the second node 2 is charged up from the ground potential GND to Vth. The delay time $t_D$ is expressed in the following equation (6):

$$t_D = C \cdot R_1 \cdot \{g_{mP4}/g_{mP2}\} \quad (6)$$

Figure 6:
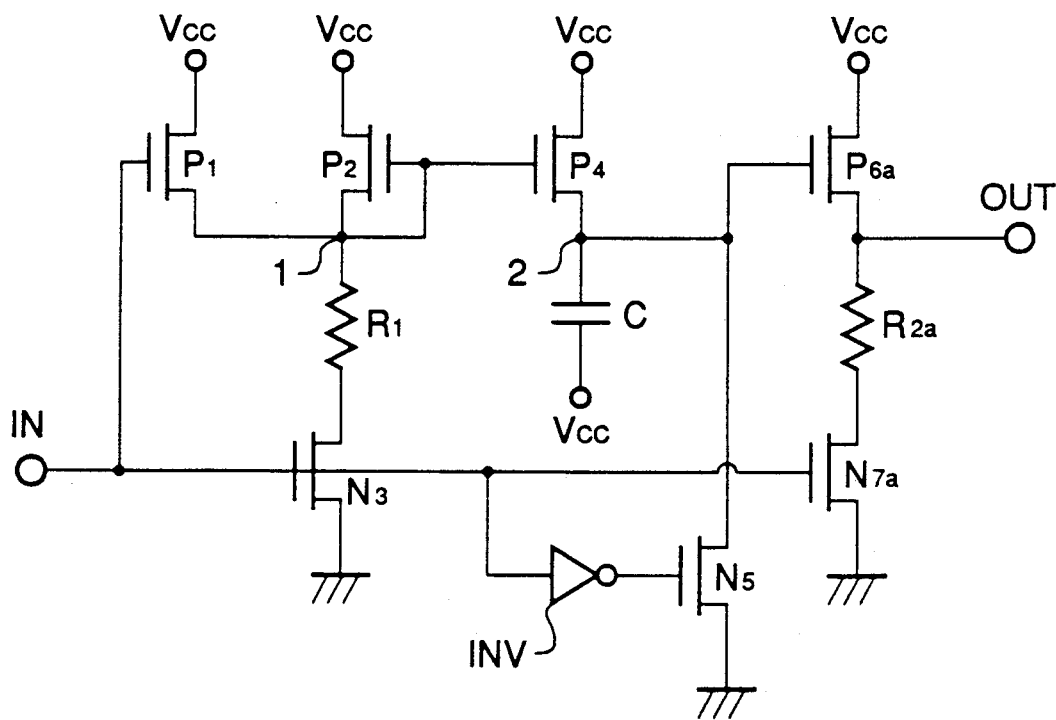
FIG. 6 is a circuit diagram of a second embodiment of the delay circuit in accordance with the present invention.

Turning to FIG. 6, there is shown a circuit diagram of a second embodiment of the delay circuit in accordance with the present invention. In FIG. 6, elements similar or corresponding to those shown in FIG. 4 are given the same Reference Numerals and Letters, and a suffix "a" is added to Reference Numerals and Letters given to elements having characteristics different from those of corresponding elements of the first embodiment. Therefore, explanation of the construction will be omitted.

As seen from comparison between FIGS. 4 and 6, the second embodiment is different from the first embodiment in that, in the second embodiment, the capacitor C is connected between the second node 2 and the first voltage supply line Vcc. However, operation of the second embodiment is the same as that of the first embodiment, and therefore, detailed explanation of the operation will be also omitted.

As can be understood from the first and second embodiments, the capacitor C can exert the same function regardless of whether one end of the capacitor is connected to the first voltage supply line Vcc or the second voltage supply line GND. Actually, therefore, the one end of the capacitor can be connected to a voltage supply line which is preferred from a viewpoint of a practical circuit layout. In other words, an increased degree of freedom in the layout can be obtained.

In the first embodiment shown in FIG. 4, it is set that the transconductances of the transistors $P_2$ and $P_6$ are the same, the transconductances of the transistors $N_3$ and $N_7$ are the same and the resistances of the resistors $R_1$ and $R_2$ are the same. In the second embodiment, consideration can be made by replacing $P_6$, $R_2$ and $N_7$ by $P_{6a}$, $R_{2a}$ and $N_{7a}$, respectively, and by setting that a transconductance $g_m$ of the transistor $P_{6a}$ is $n \times g_{mP6}$, a resistance of the resistor $R_{2a}$ is $R_2/n$, and a transconductance $g_m$ of the transistor $N_{7a}$ is $n \times g_{mN7}$. Under this condition, an inverter composed of the transistor $P_{6a}$, the resistor $R_{2a}$ and the transistor $N_{7a}$ has the same logical threshold as that of the inverter composed of the transistor $P_2$, the resistor $R_1$ and the transistor $N_3$. Therefore, the same operation as that of the first embodiment can be obtained. In this case, if $n > 1$, a power for driving a load connected to the output terminal OUT is increased, and if $n < 1$, a current flowing in the inverter composed of the transistor $P_{6a}$, the resistor $R_{2a}$ and the transistor $N_{7a}$ becomes small, and therefore, consumed power can be rendered small.

In the above mentioned embodiments, each of the resistors $R_1$ and $R_2$ can be formed with a depletion FET which is connected to function as a resistive element.

As seen from the above, the delay circuit in accordance with the present invention can have the delay time $t_D$ given in the above mentioned equation (6), which can be set by setting the capacitance of the capacitor and the resistance of the resistor and also by setting a ratio of transconductances of the transistors $P_2$ and $P_4$. Here, in a MOS integrated circuit formed on a single substrate, a ratio of transconductances of MOS- FETs of the same conduction or channel type can be set with a very high degree of precision, and therefore, the precision of the delay time is substantially governed by only the precision in the capacitance of the capacitor and in the resistance of the resistor. Accordingly, there can be obtained a delay circuit having the delay time $t_D$ which will never vary even if the characteristics (absolute precision) of the MOSFETs varies.

The invention has thus been shown and described with reference to the specific embodiments. However, it should be noted that the present invention is in no way limited to the details of the illustrated structures but changes and modifications may be made within the scope of the appended claims.

I claim:

1. A delay circuit comprising:

an input terminal and an output terminal;

a first MOSFET having a gate connected to the input terminal, and a drain-source path connected at its one end to a first node and at its other end to a first voltage supply line;

a second MOSFET having a gate connected to the first node and a drain-source path connected at its one end to the first node and at its other end to the first voltage supply line;

a third MOSFET having a gate connected to the input terminal, and a drain-source path connected at its one end through a first resistive element to the first node and at its other end to a second voltage supply line;

a fourth MOSFET having a gate connected to the first node, and a drain-source path connected at its one end to a second node and at its other end to the first voltage supply line;

a capacitive element connected between the second node and one of said first and second voltage supply lines;

a fifth MOSFET having a gate connected to receive an inverted signal of a signal applied on the input terminal, and a drain-source path connected at its one end to the second node and at its other end to the second voltage supply line;

a sixth MOSFET having a gate connected to the second node, and a drain-source path connected at its one end to the output terminal and at its other end to the first voltage supply line; and a seventh MOSFET having a gate connected to the input terminal, and a drain-source path connected at its one end through a second resistive element to the output terminal and at its other end to the second voltage supply line.

2. A circuit claimed in claim 1 wherein the capacitive element is connected between the second node and the second voltage supply line.

3. A circuit claimed in claim 1 wherein the capacitive element is connected between the second node and the first voltage supply line.

4. A delay circuit comprising:

an input terminal and an output terminal;

a first MOSFET of a first channel type having a gate connected to the input terminal, a drain connected to a first node and a source connected to a first voltage supply line;

a second MOSFET of the first channel type having a gate and a drain connected commonly to the first node and a source connected to the first voltage supply line;

a third MOSFET of a second channel type having a gate connected to the input terminal, a drain connected through a first resistor to the first node and a source connected to a second voltage supply line;

a fourth MOSFET of the first channel type having a gate connected to the first node, a drain connected to a second node and a source connected to the first voltage supply line;

a capacitor connected between the second node and one of said first and second voltage supply lines;

a fifth MOSFET of the second channel type having a gate connected to receive an inverted signal of a signal applied on the input terminal, a drain connected to the second node and a source connected to the second voltage supply line;

a sixth MOSFET of the first channel type having a gate connected to the second node, a drain connected to the output terminal and a source connected to the first voltage supply line; and a seventh MOSFET of the second channel type having a gate connected to the input terminal, a drain connected through a second resistor to the output terminal and a source connected to the second voltage supply line, the second and fourth MOSFETs forming a current mirror circuit, and transconductances of the second, third, sixth and seventh MOSFETs and resistances of the first and second resistors fulfilling the following conditions:

$$g_{m2} = n \times g_{m6}$$

$$g_{m3} = n \times g_{m7}$$

$$R_1 = R_2/n$$

where $g_{m2}$, $g_{m3}$, $g_{m6}$ and $g_{m7}$ are transconductances of the second, third, sixth and seventh MOSFETs, respectively, $R_1$ and $R_2$ are resistances of the first and second resistors, respectively, and n is positive number.

5. A circuit claimed in claim 4 wherein the first channel type is a P-channel type and the second channel type is an N-channel type.

6. A circuit claimed in claim 5 wherein the capacitor is connected between the second node and the second voltage supply line.

7. A circuit claimed in claim 5 wherein the capacitor is connected between the second node and the first voltage supply line.

8. A delay circuit comprising:

an input terminal and an output terminal;

a first inverter including a first MOSFET of a first channel type having a gate connected to the input terminal, a drain connected to a first node and a source connected to a first voltage supply line; and a second MOSFET of a second channel type having a gate connected to the input terminal, a drain connected through a first resistor to the first node and a source connected to a second voltage supply line;

a current mirror circuit having an input side current path connected in parallel to the first MOSFET, and an output side current path connected between the first voltage supply line and a second node;

a capacitor connected between the second node and one of said first and second voltage supply lines;

a third MOSFET of the second channel type having a gate connected to receive an inverted signal of a signal applied on the input terminal, a drain connected to the second node and a source connected to the second voltage supply line; and a second inverter including a fourth MOSFET of the first channel type having a gate connected to the second node, a drain connected to the output terminal and a source connected to the first voltage supply line, and a fifth MOSFET of the second channel type having a gate connected to the input terminal, a drain connected through a second resistor to the output terminal and a source connected to the second voltage supply line.

* * * * *